United States Patent
Choi et al.

(10) Patent No.: US 7,499,316 B2
(45) Date of Patent: Mar. 3, 2009

(54) PHASE CHANGE MEMORY DEVICES AND PROGRAM METHODS

(75) Inventors: Byung-Gil Choi, Yongin-si (KR);
Du-Eung Kim, Yongin-si (KR);
Yu-Hwan Ro, Seocho-gu (KR);
Joon-Yong Choi, Dongjak-gu (KR);
Beak-Hyung Cho, Hwaseong-si (KR);
Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 11 days.

(21) Appl. No.: 11/723,354

(22) Filed: Mar. 19, 2007

(65) Prior Publication Data
US 2007/0230239 A1 Oct. 4, 2007

Related U.S. Application Data

(63) Continuation-in-part of application No. 11/724,268, filed on Mar. 15, 2007.

(30) Foreign Application Priority Data

Mar. 31, 2006 (KR) .................... 10-2006-0029692
Dec. 22, 2006 (KR) .................... 10-2006-0132684

(51) Int. Cl.
*G11C 11/00* (2006.01)
(52) U.S. Cl. .................. 365/163; 365/151; 365/230.06
(58) Field of Classification Search .................. 365/163, 365/148, 151, 230.06
See application file for complete search history.

(56) References Cited

U.S. PATENT DOCUMENTS

| 6,480,438 | B1* | 11/2002 | Park .................. 365/230.06 |
| 6,487,113 | B1* | 11/2002 | Park et al. .................. 365/163 |
| 6,590,807 | B2 | 7/2003 | Lowrey |
| 6,928,022 | B2* | 8/2005 | Cho et al. .................. 365/225.7 |
| 7,012,834 | B2* | 3/2006 | Cho et al. .................. 365/163 |
| 7,262,990 | B2* | 8/2007 | Cho et al. .................. 365/163 |
| 2005/0128799 | A1 | 6/2005 | Kurotsuchi et al. |
| 2005/0169093 | A1 | 8/2005 | Choi et al. |
| 2006/0007729 | A1 | 1/2006 | Cho et al. |
| 2007/0230240 | A1* | 10/2007 | Choi et al .................. 365/163 |

FOREIGN PATENT DOCUMENTS

| JP | 2005-166210 | 6/2005 |
| JP | 2005-222687 | 8/2005 |
| JP | 2006-024355 | 1/2006 |
| KR | 1020040105008 A | 12/2004 |
| KR | 1020050054851 A | 6/2005 |
| KR | 1020050079030 A | 8/2005 |
| KR | 1020060004289 A | 1/2006 |
| KR | 100564636 B1 | 3/2006 |

* cited by examiner

*Primary Examiner*—Gene N. Auduong
(74) *Attorney, Agent, or Firm*—Volentine & Whitt, PLLC

(57) ABSTRACT

A phase change memory device is disclosed. It includes a memory cell array including a plurality of memory cells programmed in relation to a phase change material, and a write driver circuit configured to provide a set current and a reset current to a selected memory cell. The write driver circuit includes a set current driver configured to provide the set current and a reset current driver configured to provide the reset current.

11 Claims, 6 Drawing Sheets

PHASE CHANGE MEMORY DEVICES AND PROGRAM METHODS

STATEMENT OF RELATED APPLICATIONS

This application is a Continuation in Part (CIP) of U.S. patent application Ser. No. 11/724,268, filed Mar. 15, 2007. A claim of priority under 35 U.S.C. § 119 is made to Korean Patent Application No. 2006-029692 filed on Mar. 31, 2006 and Korean Patent Application No. 2006-132684 filed Dec. 22, 2006, the collective subject matter of which is hereby incorporated by reference.

BACKGROUND OF THE INVENTION

1. Field of the Invention

The present invention relates to nonvolatile semiconductor memory devices. More particularly, the invention relates to phase change memory devices and methods for applying a program current.

2. Discussion of Related Art

Phase change memory devices are one class of nonvolatile memory devices. Instead of storing electrical charge to indicate a date value, as is done in other nonvolatile memory devices, the state of a phase change material, such as Ge—Sb—Te (GST), is used to indicate a data value.

Figure (FIG.) 1 is a circuit diagram illustrating a memory cell 10 in a conventional phase change memory device. Memory cell 10 includes a memory element 11 and a select element 12 connected in series between a bitline BL and ground.

Memory element 11 includes a phase change material which functions as a variable resistor in accordance with applied temperature. That is, the phase change material is responsive to resistive heating induced by current applied via bitline BL. Under the influence of this programming technique, the phase change material may be placed in one of two stable resistive states, namely, a crystalline state or an amorphous state.

In the illustrated example, select element 12 is implemented as an NMOS transistor NT having a gate connected to a wordline WL. When a predetermined voltage is applied to the wordline WL, the NMOS transistor NT is turned ON. When the NMOS transistor NT is turned ON, memory element 11 receives a current through the bitline BL. In FIG. 1, memory element 11 is coupled between the bitline BL and the select element 12. However, the select element 12 may alternately be coupled between the bitline BL and the memory element 11.

FIG. 2 is a circuit diagram illustrating another memory cell 20 of a conventional phase change memory device. Memory cell 20 includes a memory element 21 and a select element 22 connected in series between a bitline BL and a wordline WL. Memory element 21 may be identical to memory element 11 of FIG. 1.

In the example illustrated in FIG. 2, select element 22 is implemented as a diode D. Memory element 21 is connected to the anode of the diode D, and the wordline WL is connected to its cathode. When a voltage difference between the anode and cathode of the diode D rises above a defined threshold voltage, the diode D is turned ON. When the diode D is turned ON, memory element 21 receives a current via the bitline BL.

FIG. 3 is a graph illustrating the heating characteristics of the phase change material (e.g., GST) of FIGS. 1 and 2. In FIG. 3, reference numeral 1 denotes a condition wherein the phase change material enters an amorphous state, and reference numeral 2 denotes a condition wherein the phase change material enters a crystalline state.

Referring to FIG. 3, when electrical current is applied to the phase change material such that its temperature rises above a defined melting point temperature TM during a first time period T1, the phase change material is said to be "quenched," and the phase change material enters its amorphous state. The amorphous state is generally referred to as a reset state and is conventionally equated with a data value of '1'.

In contrast, when the phase change material is heated to and held at a predetermined temperature lower than the melting point temperature TM but higher than a crystallization temperature Tc during a second time period T2 longer than the first time period T1, and thereafter slowly cooled, the phase change material enters its crystalline state. The crystalline state is generally referred to as a set state and is conventionally equated with a data value of '0'. The resistance of the memory cell is changed in accordance with the amorphous volume of the phase change material. Thus, the resistance of the phase change material forming the memory cell is higher in its amorphous state than in its crystalline state.

The phase change memory device is associated with a write driver circuit supplying a program current to the phase change material during program operations. The write driver circuit supplies the program current, ranging nominally between a set current and a reset current, to the memory cell. The program current in conventionally developed in relation to an externally applied power voltage, (e.g., 2.5 V or higher). The set current forces the phase change material of the memory cell into a set state, and the reset current forces the phase change material of the memory cell into a reset state.

FIG. 4 is a circuit diagram illustrating one possible write driver circuit 30 conventionally applied to phase change memory devices. This write driver circuit 30 is disclosed in some additional detail in Korean Patent Application No. 2003-35607. However, as summarized here, write driver 30 includes a pulse control circuit 31, a current control circuit 32, and a current driving circuit 33. Pulse control circuit 31 includes first and second transmission gates TG1 and TG2, and first through third inverters INV1~INV3. Current control circuit 32 includes first through seventh transistors TR1~TR7, first through fifth transistors TR1~TR5 being NMOS transistors, sixth and seventh transistors TR6 and TR7 being PMOS transistors. Current driving circuit 33 includes a pull-up transistor PUTR and a pull-down transistor PDTR.

First, a program operation for input data DATA having a value of '0' will be described. When the input data DATA is '0', the second transmission gate TG2 of pulse control circuit 31 is turned ON, and the third and fourth transistors TR3 and TR4 of current control circuit 32 are turned OFF. In response to a set pulse P_SET, the fifth transistor TR5 is turned ON, and the seventh transistor TR7 and the pull-down transistor PDTR are turned OFF. Due to the current mirror effect, a current flowing through transistors TR1, TR2, TR5 and TR6 forming a first current path flows through a pull-up transistor PUTR. The current flowing through the pull-up transistor PUTR is a set current I_SET, and is provided to a memory cell MC through a data line DL.

Next, a program operation for input data DATA having a value of '1' will be described. When the input data DATA is '1', the first transmission gate TG1 of pulse control circuit 31 and the third and fourth transistors TR3 and TR4 of current control circuit 32 are turned ON. In response to a reset pulse P_RST, the fifth transistor TR5 is turned ON, and the seventh transistor TR7 and the pull-down transistor PDTR are turned OFF. Due to the current mirror effect, a current flowing through transistors TR1, TR2, TR5 and TR6 forming a first current path and a current flowing through the transistors TR3, TR4, TR5 and TR6 forming a second current path flows through a pull-up transistor PUTR. The current flowing through the pull-up transistor PUTR is a reset current I_RST, and is provided to the memory cell MC through the data line DL.

Therefore, the reset current I_RST is greater than the set current I_SET. Meanwhile, the reset pulse P_RST has a smaller pulse width than the set pulse P_SET. That is, the reset current I_RST has a greater current value and smaller pulse width than the set current I_SET. A selected memory cell is programmed such that it enters the reset state or the set state according to the reset current I_RST or the set current I_SET, correspondingly.

To program data a '1' or '0' in the foregoing phase change memory device, it is necessary to control the magnitude and duration of the program current in accordance with the value of the data being stored. The conventional write driver circuit 30 illustrated in FIG. 3 provides both the set current and the reset current using a single current driving circuit 33. That is, the conventional write driver circuit has a structure that commonly controls the set current and the reset current using a single current mirror circuit. In the set program operation, the current flowing through the first current path is provided to the memory cell MC. In the reset program operation, the current flowing through the first and second current paths is provided to the memory cell MC.

In the reset program operation, the conventional write driver generates a current of about 0.15 to 0.2 milliampere flowing through the second current path, and a current of about 1.0 milliampere flowing through current driving circuit 33 as well as the current flowing through the first current path. That is, in the reset program operation, the conventional write driver requires a higher current than that required for the set program operation by about 1.2 milliampere. In the above-described example, although the conventional write driver requires a current of about 1 milliampere in the reset program operation, there is a problem in that a current of about 0.12 milliampere is unnecessarily consumed through the second current path.

SUMMARY OF THE INVENTION

In one embodiment, the invention provides a phase change memory device, comprising; a memory cell array including a plurality of memory cells programmed in relation to a phase change material, and a write driver circuit configured to provide a set current and a reset current to a selected memory cell, wherein the write driver circuit comprises a set current driver configured to provide the set current and a reset current driver configured to provide the reset current.

In another embodiment, the invention a method of programming a phase change memory device, the phase change memory device comprising an array of memory cells each programmed in relation to a phase change material, and a write driver circuit including a set current driver and a reset current driver configured to provide set current and reset current to a selected memory cell respectively, the method comprising; receiving a set pulse or a reset pulse in accordance with a logic level of input data, generating a reset control signal in response to the input data and the reset pulse, receiving a reset DC voltage in response to the reset control signal, and providing the reset current to the selected memory cell in response to the reset DC voltage.

DESCRIPTION OF EMBODIMENTS

Embodiments of the invention will now be described in some additional detail with reference to the accompanying drawings. Throughout the written description and drawings, like reference numbers indicate like or similar elements.

Figure 5:
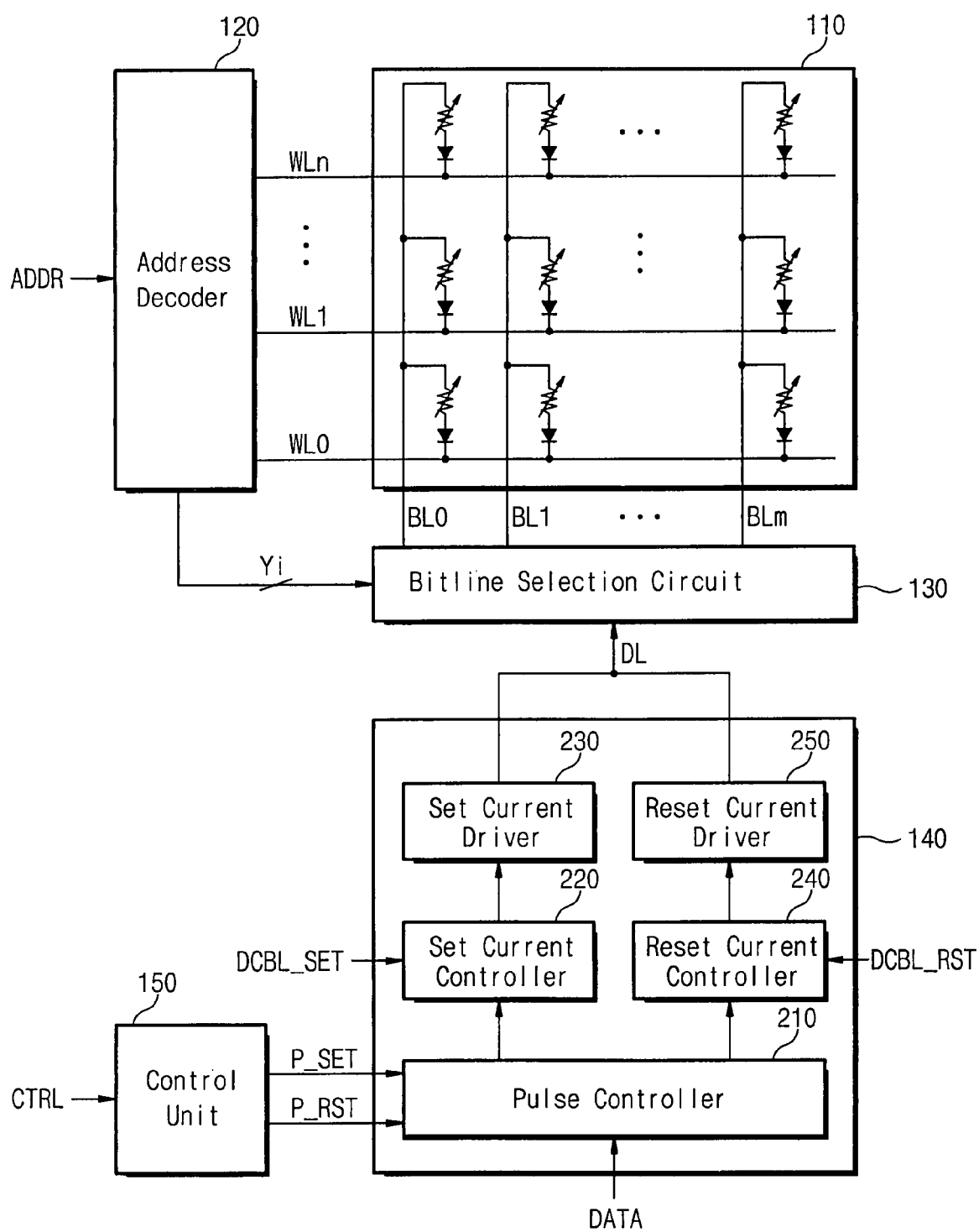
FIG. 5 is a block diagram illustrating a phase change memory device according to the present invention.

FIG. 5 is a block diagram illustrating a phase change memory device 100 according to an embodiment of the invention. Referring to FIG. 5, phase change memory device 100 includes a memory cell array 110, an address decoder 102, a bitline selection circuit 130, a write driver circuit 140 and a control unit 150.

Memory cell array 110 includes a plurality of memory cells. Each of the memory cells is configured with a memory element and a select element. The memory element includes a phase change material, such as a GST, and the select element, such as a diode D (as represented in FIG. 5) or alternately an NMOS transistor.

Address decoder 120 is connected to memory cell array 110 via wordlines WL0~WLn. Address decoder 120 decodes an externally applied address ADDR, and provides a bias voltage to a selected wordline. In addition, address decoder 120 generates a selection signal Yi selecting bitlines BL0~BLm. The selection signal Yi is provided to bitline selection circuit 130.

Bitline selection circuit 130 is connected to memory cell array 110 via bitline bitlines BL0~BLm. Bitline selection circuit 130 selects a bitline in response to the selection signal Yi provided by address decoder 120. Bitline selection circuit 130 includes a plurality of NMOS transistors (not shown). Each NMOS transistor electrically connects a bitline to a data line DL in response to the selection signal Yi.

Write driver circuit 140 receives a program pulse P_SET and P_RST and data DATA, and provides a program current to the data line DL. The program pulse includes a set pulse P_SET and a reset pulse P_RST, and a program current includes a set current I_SET and a reset current I_RST. Write driver circuit 140 provides the set current I_SET in response to the set pulse P_SET when the data '0' is input, and provides the reset current I_RST in response to the reset pulse P_RST when the data '1' is input.

Referring to FIG. 5, write driver circuit 140 includes a pulse controller 210, a set current controller 220, a set current driver 230, a reset current controller 240, and a reset current driver 250. In addition to set current driver 230 generating the set current, write driver circuit 140 includes reset current driver 240 generating the reset current.

Pulse controller 210 receives the program pulse P_SET and P_RST from control unit 150 and the data DATA from a data input buffer (not shown), and generates a control signal for controlling set current controller 220 and reset current controller 240. Set current controller 220 and reset current controller 240 operate in response to the control signal received from pulse controller 210, and respectively control set current driver 230 and reset current driver 250 in response to DC currents DCBL_SET and DCBL_RST.

Set current driver 230 and reset current driver 250 generate the set current I_SET and the reset current I_RST under the control of set current controller 220 and reset current controller 240. The exemplary constitution and operation of write driver circuit 140 shown in FIG. 5 will be described in some addition detail with reference to FIG. 6.

Referring again to FIG. 5, control unit 150 generates the program pulses P_SET and P_RST in response to one or more conventionally understood control signals CTRL (e.g., /CS, /WE, /OE, and the like). Control unit 150 provides the program pulse P_SET and P_RST to pulse controller 210 of write driver circuit 140.

Since the conventional write driver circuit (e.g., write driver circuit 30 of FIG. 4) generates the set current or reset current using only one current driving circuit, both first and second current paths are required. That is, the current flows through the first current path when the set current is generated, but the current flows through the first and second current paths when the reset current is generated. When the reset current is generated, the conventional write driver circuit needs about 0.2 milliampere of current flowing through the second current path as well as the first current path, and also needs about 1 milliampere of current flowing through current driving circuit 33.

However, in a phase change memory device according to an embodiment of the invention, write driver circuit 140 includes reset current driver 250 in addition to set current driver 230. Write driver circuit 140 generates the reset current through reset current driver 250. That is, write driver circuit 250 needs only the about 1 milliampere of current flowing through reset current driver 250 when the reset current is generated. Therefore, write driver circuit 140 may operate with reduced current consumption by an amount of about 0.2 milliampere under the foregoing assumptions and as compared with the conventional write driver shown in FIG. 4.

Figure 6:
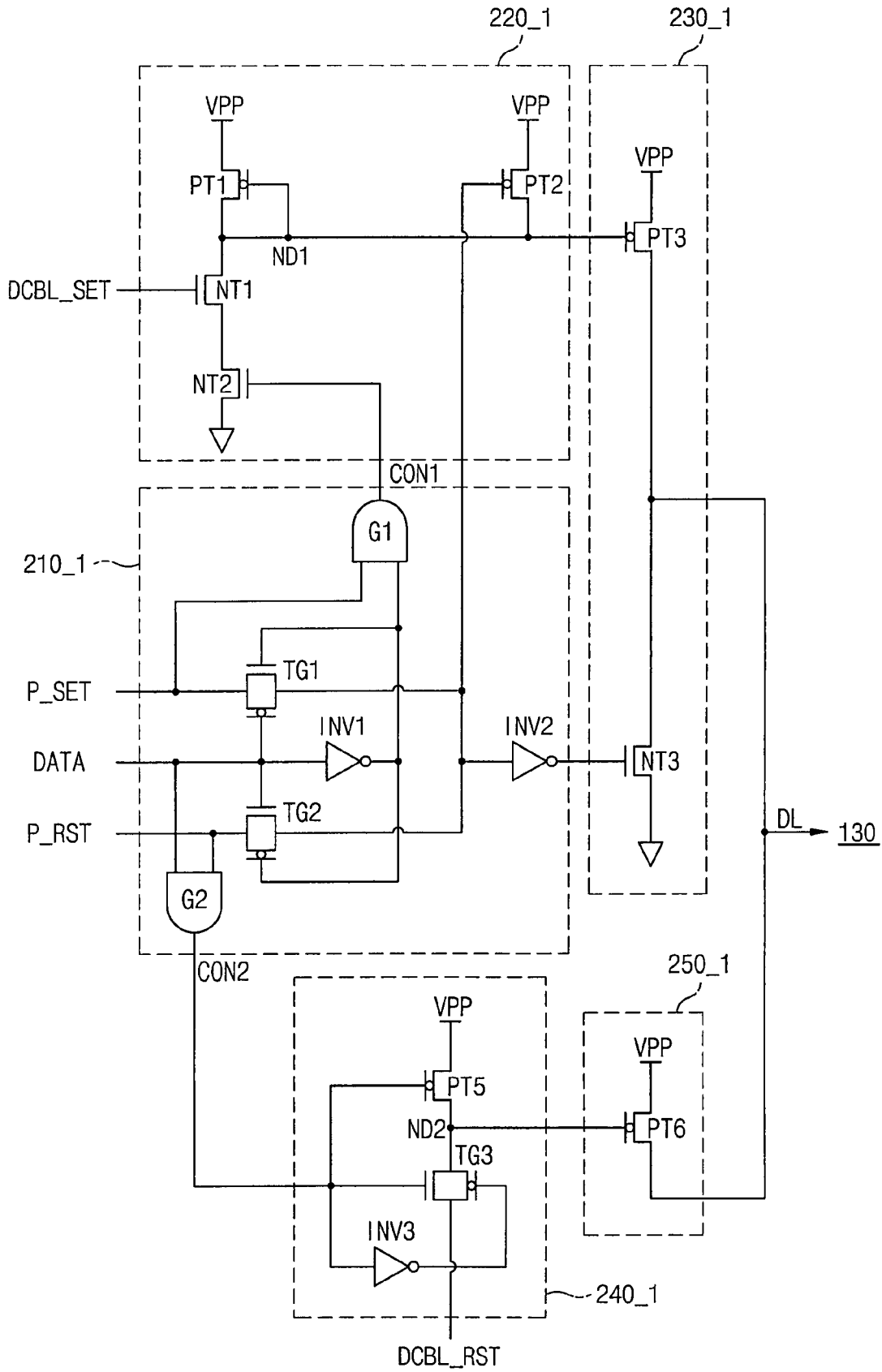
FIG. 6 is a circuit diagram illustrating an example of a write driver circuit of FIG. 5.

FIG. 6 is a circuit diagram further illustrating write driver circuit 140 shown in FIG. 5. Referring to FIG. 6, an exemplary write driver circuit 140_1 includes a pulse controller 210_1, a set current controller 220_1, a set current driver 230_1, a reset current controller 240_1, and a reset current driver 250_1.

Pulse controller 210_1 includes first and second transmission gates TG1 and TG2, first and second control signal generators G1 and G2, and first and second inverters INV1 and INV2. Pulse controller 210_1 generates one of the reset pulse P_RST and the set pulse P_SET in response to logic level of the data DATA. In addition, pulse controller 210_1 generates a set control signal CON1 in response to the data DATA and the set pulse signal P_SET, and generates a reset control signal CON2 in response to the data DATA and the reset pulse P_RST.

When the input data DATA is '0' and the set pulse P_SET is enabled, the first control signal generator G1 generates the set control signal CON1. The set control signal CON1 is provided to the set current controller 220_1. On the contrary, when the input data DATA is '1' and the reset pulse P_RST is enabled, the second control signal generator G2 generates the reset control signal CON2. The reset control signal CON2 is provided to reset current controller 240_1.

Set current controller 220_1 includes first and second PMOS transistors PT1 and PT2, first and second NMOS transistors NT1 and NT2. The first PMOS transistor PT1, and the first and second NMOS transistors NT1 and NT2 form one current path. The second PMOS transistor PT2 acts as a set current cut-off circuit for preventing the generation of the set current I_SET.

The first PMOS transistor PT1 is coupled between a power terminal VPP and a first node ND1. A gate of the first PMOS transistor PT1 is connected to a first node ND1. The first NMOS transistor NT1 is coupled between the first node ND1 and the second NMOS transistor NT2. A set DC voltage DCBL_SET is applied to a gate of the first NMOS transistor NT1. The second NMOS transistor NT2 is coupled between the first NMOS transistor NT1 and a ground. The set control signal CON1 is applied to a gate of the second NMOS transistor NT2. The second PMOS transistor PT2 is connected to a power terminal VPP and the first node ND1. The program pulse P_SET and P_RST is applied to the gate of the second PMOS transistor PT2. When the program pulse P_SET and P_RST is disabled, the second PMOS transistor PT2 prevents the set current I_SET from being generated from set current driver 230_1.

When the set control signal CON1 is applied to the second NMOS transistor NT2, the first PMOS transistor PT1 and the first and second NMOS transistors NT1 and NT2 form one current path. A current, of which the magnitude is equal to that of the current flowing through the current path, flows through set current driver 230_1. The current flowing through set current driver 230_1, which is the set current I_SET, is provided to the selected memory cell through the data line DL. The set current I_SET is the current for programming the memory cell such that it becomes the set state.

Reset current controller 240_1 includes a third transmission gate TG3, a fifth PMOS transistor PT5, and a third inverter INV3. Reset current controller 240_1 provides a reset DC voltage DCBL_RST to reset current driver 250 in response to the reset control signal CON2. The reset DC voltage DCBL_RST has a voltage level of about 0 V.

The fifth PMOS transistor PT5 is coupled between the power terminal VPP and a second node ND2. When the reset control signal CON2 is applied, the fifth PMOS transistor PT5 is turned OFF. On the contrary, when the reset control signal CON2 is disabled, the fifth PMOS transistor PT5 is turned ON. When the fifth PMOS transistor PT5 is turned ON, the second node ND2 becomes logic high level. The generation of reset current by reset current driver 250_1 is inhibited.

Meanwhile, when the firth PMOS transistor PT5 is turned OFF, reset current controller 240_1 receives a reset DC voltage DCBL_RST. Reset current driver 250_1 generates the reset current I_RST in response to the reset DC voltage DCBL_RST. The reset current I_RST programs the memory cell such that it enters its reset state.

Set current driver 230_1 includes a third PMOS transistor PT3 and a third NMOS transistor NT3. Reset current driver 250_1 includes a sixth PMOS transistor PT6. Set current driver 230_1 generates the set current I_SET in response to the level of the first node ND1. Reset current driver 250_1 generates the reset current I_RST in response to the level of the second node ND2. When the reset DC voltage DCBL_RST is 0 V, the reset current I_RST generated from reset current driver 250 has a maximum value.

Returning to FIG. 5, write driver circuit 140 of the phase change memory device 100 according to an embodiment of the invention includes set current driver 230 and reset current driver 250. Write driver circuit 140 drives set current driver 230 when the set current is generated, and reset current driver 250 when the reset current is generated. Within the context of the illustrated embodiments, a reset current of about 1 milliampere is generated through reset current driver 250. Therefore, write driver circuit 140 is able to operate with a reduced current consumption of about 0.2 milliampere in comparison with the conventional write driver described in relation to FIG. 4.

Figure 7:
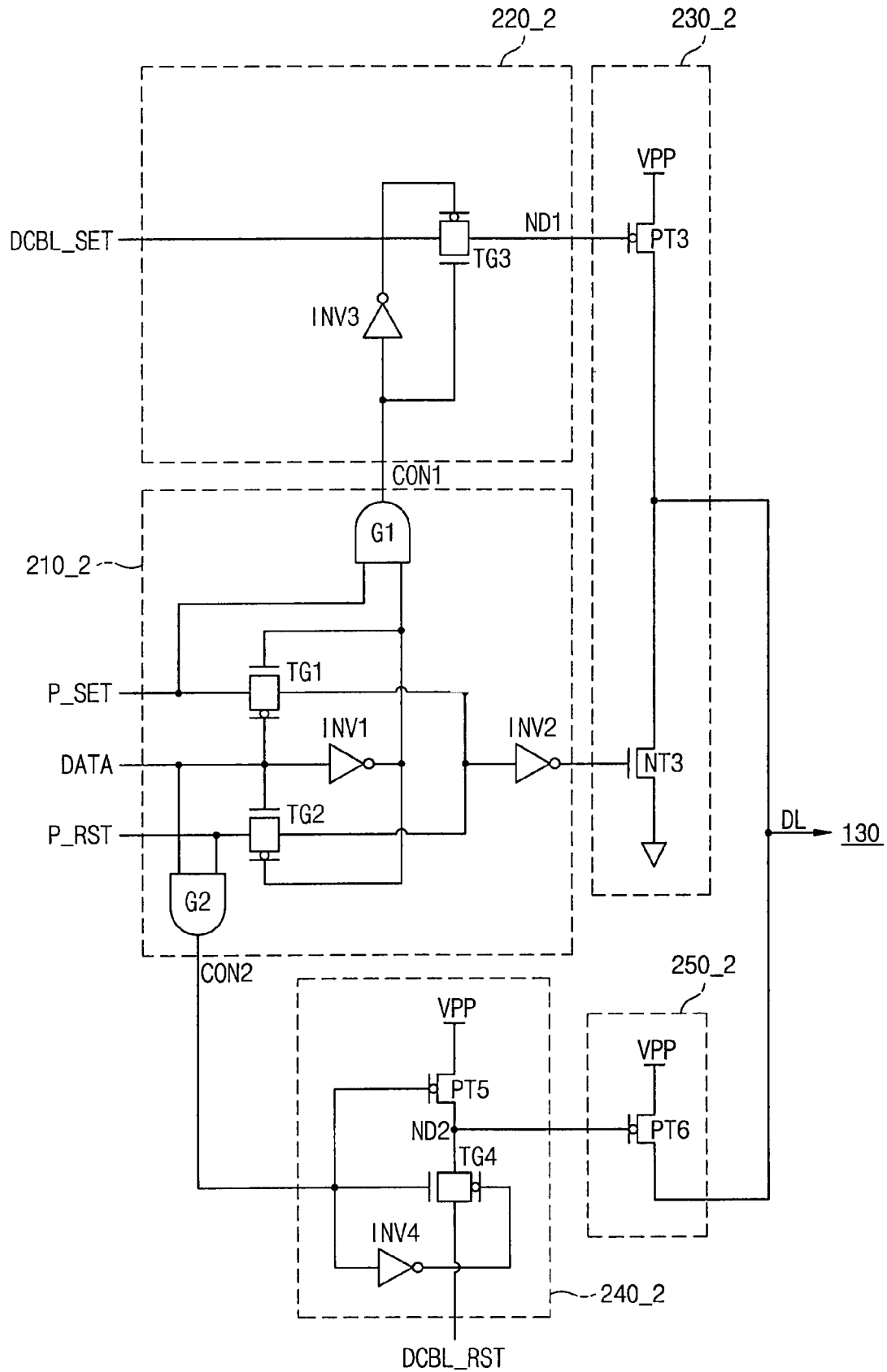
FIG. 7 is a circuit diagram illustrating another example of a write driver circuit of FIG. 5.

FIG. 7 is a circuit diagram illustrating another embodiment of write driver circuit 140 shown in FIG. 5. Referring to FIG. 7, a write driver circuit 140_2 includes a pulse controller 210_2, a set current controller 220_2, a set current driver 230_2, a reset current controller 240_2, and a reset current driver 250_2.

Pulse controller 210_2 may have the same configuration as pulse controller 210_1 of FIG. 6. Pulse controller 210_2 generates a set control signal CON1 in response to data DATA and a set pulse P_SET and generates a reset control signal CON2 in response to the data DATA and a reset pulse P_RST. When the input data DATA is '0' and the set pulse P_SET is enabled, a first control signal generator G1 generates the set control signal CON1. The set control signal CON1 is provided to set current controller 220_2. When the input data DATA is '1' and the reset pulse P_RST is enabled, a second control signal generator G2 generates the reset control signal CON2. The reset control signal is provided to reset current controller 240_2.

Set current controller 220_2 includes a third transmission gate TG3 and a third inverter INV3. Set current controller 220_2 transmits a set DC current DCBL_SET to a first node ND1 in response to the set control signal CON1. The first node ND1 is connected to the set current driver 230_2.

Set current driver 230_2 includes a third PMOS transistor PT3 and a third NMOS transistor NT3. The third PMOS transistor PT3 is turned ON or OFF depending on the level of the first node ND1. Set current driver 230_2 generates set current I_SET in response to the level of the first node ND1. The current flowing to set current driver 230_2 is the set current to be provided to a selected memory cell through a data line DL. The set current I_SET programs the memory cell such that it enters its set state.

Reset current controller 240_2 includes a fourth transmission gate TG4, a fifth transistor PT5, and a fourth inverter INV4. Reset current controller 240_2 provides reset DC voltage DCBL_RST to reset current driver 250_2 in response to the reset control signal CON2. The reset DC voltage DCBL_RST has the level of about 0V.

The fifth PMOS transistor PT5 is coupled between a power terminal VPP and a second node ND2. The reset control signal CON2 is applied to a gate of the fifth PMOS transistor PT5. The fifth PMOS transistor PT5 is turned OFF when the reset control signal CON2 is enabled. On the other hand, the fifth PMOS transistor PT5 is turned ON when the reset control signal CON2 is disabled. When the fifth PMOS transistor PT5 is turned ON, the second node ND2 becomes logic high level. At this point, the generation of reset current from reset current driver 205_2 is inhibited.

Meanwhile, when the fifth PMOS transistor PT5 is turned OFF, reset current controller 240_2 receives the reset DC voltage DCBL_RST. Reset current driver 250_2 generates reset current I_RST in response to the reset DC voltage DCBL_RST. The reset current I_RST programs the memory cell such that it enters its reset state.

Set current driver 230_2 generates set current I_SET in response to the level of a first node ND1. Reset current driver 250_2 generates reset current I_RST in response to the level of the second node ND2. When the reset DC voltage DCBL_RST is 0V, the reset current I_RST generated from reset current driver 250_2 has a maximum value.

Figure 1:
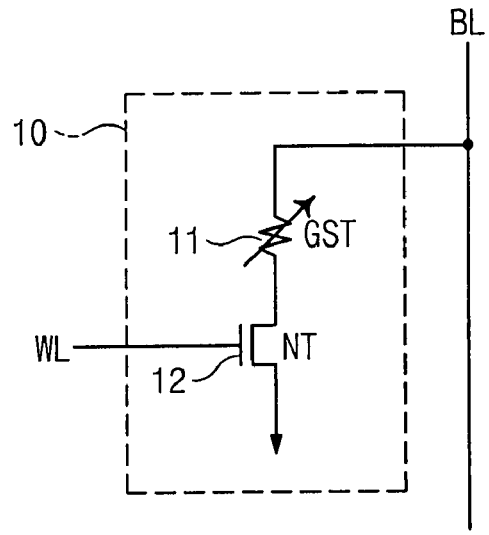
FIG. 1 is a circuit diagram illustrating a memory cell of a conventional phase change memory device.
Figure 2:
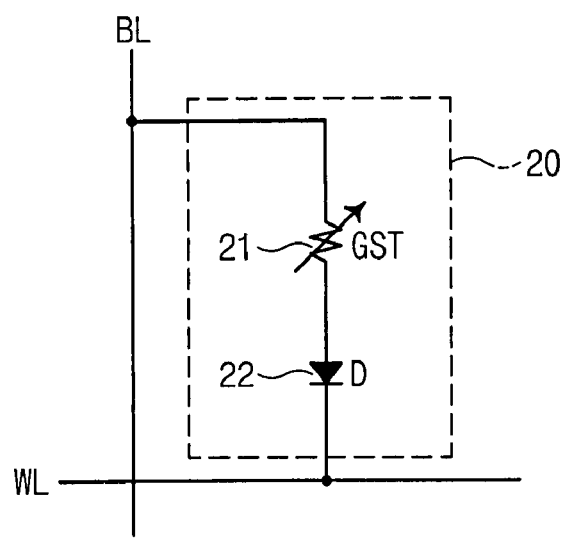
FIG. 2 is a circuit diagram illustrating another memory cell of a conventional phase change memory device.
Figure 3:
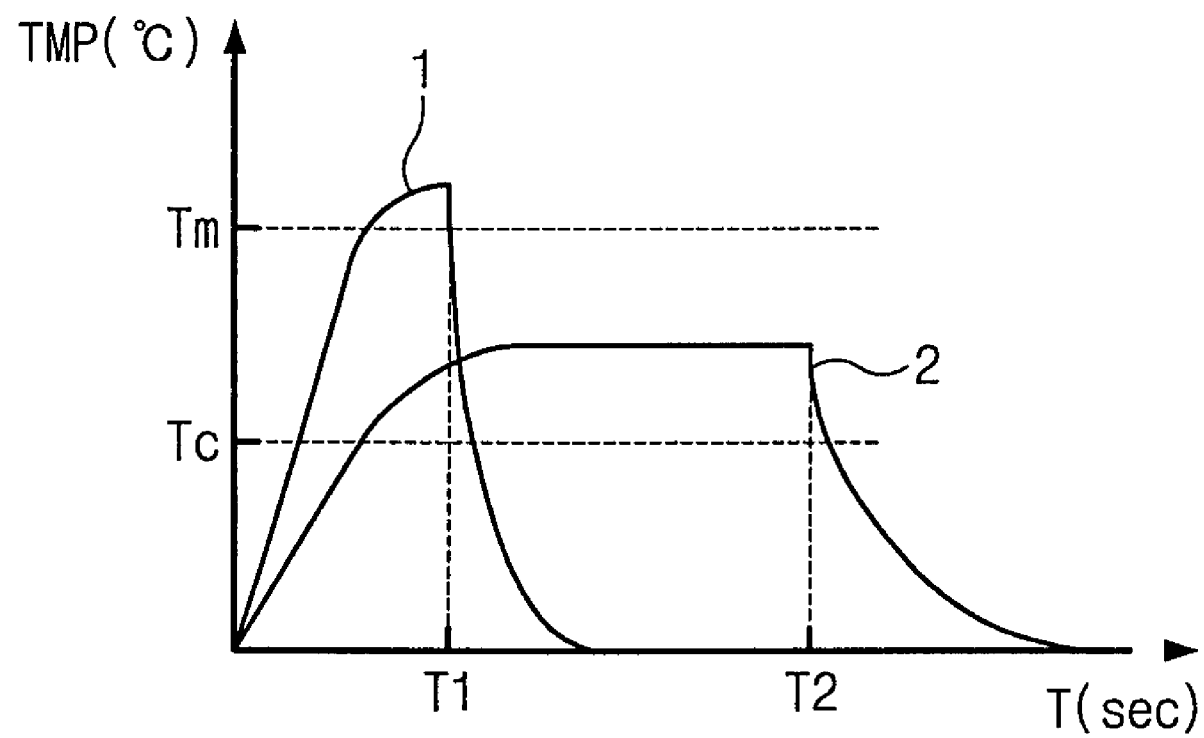
FIG. 3 is a graph illustrating characteristics of the phase change material of FIGS. 1 and 2.
Figure 4:
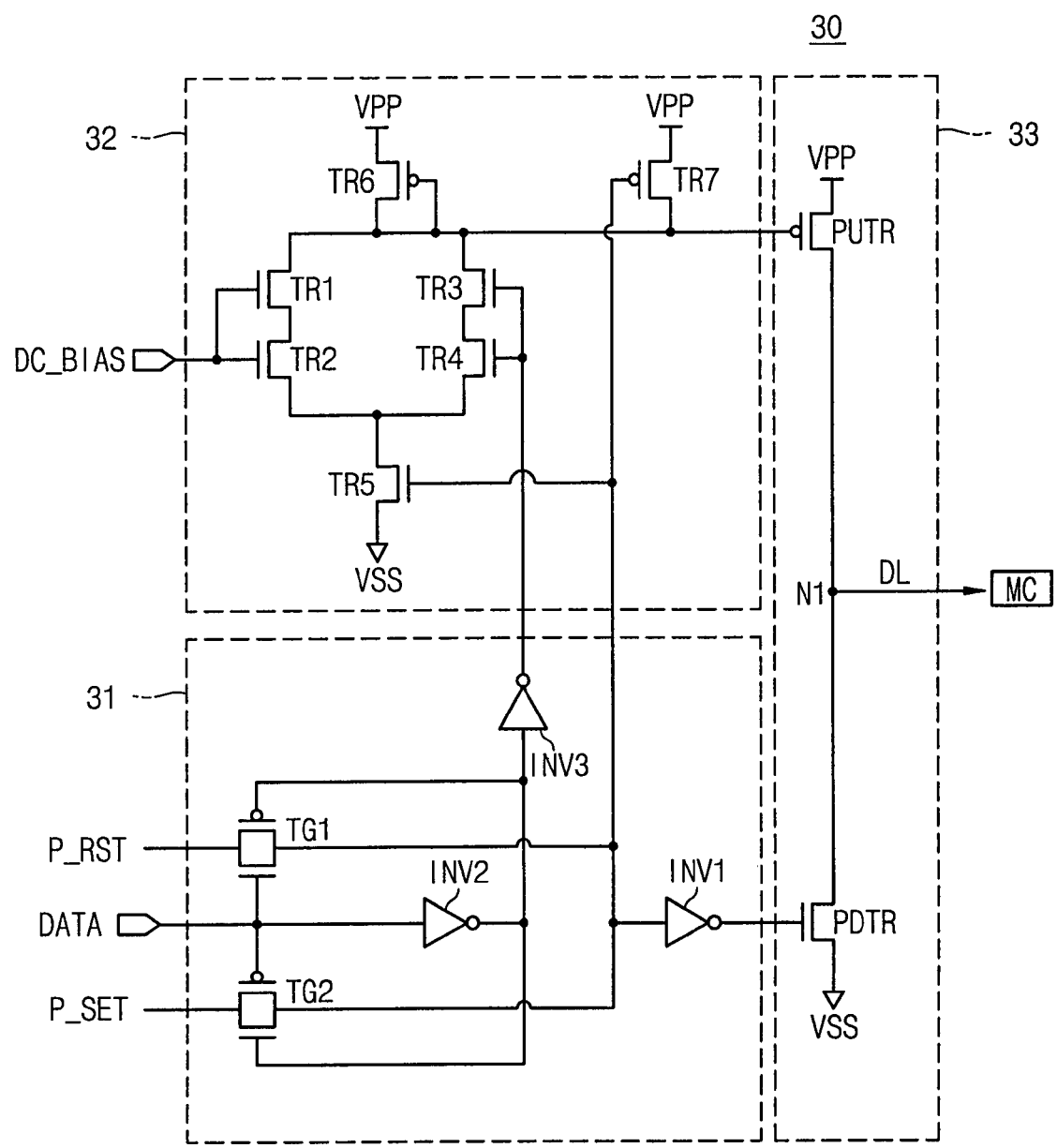
FIG. 4 is a circuit diagram illustrating a write driver circuit of a conventional phase change memory device.

Write driver circuit 140_2 illustrated in FIG. 7 does not have the first and second current paths illustrated in FIG. 4. Thus, the phase change memory device 100 according to this embodiment of the invention may be operated with reduced power consumption during a write operation.

As described above, the phase change memory device according to an embodiment of the invention includes write driver circuit comprising a set current driver and a reset current driver. The write driver circuit drives the set current driver when a set current is generated and the reset current driver when a reset current is generated. Since the reset current is generated through the reset current driver, current consumption is reduced by the amount of current flowing through first and second current paths in comparison with the conventional write driver circuit.

The foregoing embodiments should be considered illustrative, and not restrictive, and the appended claims are intended to cover all modifications, enhancements, and related embodiments that fall within the scope of the present invention. Thus, to the maximum extent allowed by law, the scope of the present invention is to be determined by the broadest permissible interpretation of the following claims and their equivalents, and shall not be restricted or limited to only the foregoing illustrated examples.

What is claimed is:

1. A variable resistance memory device, comprising:
    a memory cell array including a plurality of memory cells programmed in relation to a variable resistance; and
    a write driver circuit configured to provide a set current and a reset current to a selected memory cell in the memory cell array,
    wherein the write driver circuit comprises;
        a set current driver configured to provide the set current and controlled by a set current controller operating in response to a set control signal and a set direct current (DC) voltage, wherein the set current controller comprises a transmission gate receiving the set DC voltage and transmitting the set DC voltage to the set current driver in response to the set control signal, and
        a reset current driver separately configured from the set current driver to provide the reset current.

2. The variable resistance memory device of claim 1, wherein the write driver circuit further comprises:
    a pulse controller configured to receive a set pulse or a reset pulse according to a logic level of input data, and generate the set control signal in response to the set pulse or the reset control signal in response to the reset pulse; and
    the reset current controller operates in response to the reset control signal to control the magnitude of the reset current in response to a reset DC voltage.

3. The variable resistance memory device of claim 2, wherein the pulse controller comprises:
    a first transmission gate configured to receive the set pulse;
    a second transmission gate configured to receive the reset pulse;
    a set control signal generator configured to generate the set control signal in response to the input data and the set pulse; and
    a reset control signal generator configured to generate the reset control signal in response to the input data and the reset pulse.

4. The variable resistance memory device of claim 2, wherein the reset current controller comprises:

a PMOS transistor connected between a power terminal and a reset node, and having a gate receiving the reset control signal; and a transmission gate transferring the reset DC voltage to the reset node in response to the reset control signal.

5. The variable resistance memory device of claim 4, wherein the reset current driver controls the magnitude of the reset current in relation to the reset DC voltage.

6. The variable resistance memory device of claim 2, wherein the reset DC voltage is 0 V.

7. The variable resistance memory device of claim 6, wherein the reset current driver comprises a PMOS transistor configured to generate the reset current in relation to the reset DC voltage.

8. The variable resistance memory device of claim 1, wherein the set current controller further comprises an inverter receiving the set control signal and applying an inverted version of the set control signal to the transmission gate as a control signal.

9. The variable resistance memory device of claim 1, wherein each one of the plurality of memory cells comprises:

a memory element containing the phase change material; and a select element for selecting the memory cell, the select element including a diode connected between the memory element and a wordline.

10. A method of programming a variable resistance memory device, the variable resistance memory device comprising an array of memory cells each programmed in relation to a a variable resistance, and a write driver circuit comprising a pulse controller, a set current driver and a corresponding set current controller, and a reset current driver and a corresponding reset current controller, the method comprising:

receiving in the pulse controller one of a set pulse or a reset pulse in accordance with a logic level of input data, wherein upon receiving the set pulse generating a set control signal and communicating the set control signal to the set current controller and upon receiving the reset pulse generating a reset control signal and communicating the reset control signal to the reset current controller;

generating a reset current in the reset current driver, as controlled by the reset current controller in response to the reset control signal and a reset direct current (DC) voltage; and generating a set current in the set current driver, as controller by the set current controller in response to the set control signal and a set DC voltage, wherein the set current controller comprises a transmission gate transmitting the set DC voltage in response to the set control signal.

11. The method of claim 10, wherein the reset current driver controls the magnitude of the reset current in relation to the reset DC voltage.

* * * * *